US012628274B2

(12) United States Patent
Higashi et al.

(10) Patent No.: US 12,628,274 B2
(45) Date of Patent: May 12, 2026

(54) WIRING BOARD

(71) Applicant: KYOCERA Corporation, Kyoto (JP)

(72) Inventors: Toshifumi Higashi, Kirishima (JP);
Hiroaki Sano, Kagoshima (JP); **Akira
Imoto, Kirishima (JP); Sentarou
Yamamoto**, Kagoshima (JP)

(73) Assignee: KYOCERA Corporation, Kyoto (JP)

( * ) Notice: Subject to any disclaimer, the term of this
patent is extended or adjusted under 35
U.S.C. 154(b) by 211 days.

(21) Appl. No.: 18/271,871

(22) PCT Filed: Jan. 24, 2022

(86) PCT No.: PCT/JP2022/002423
§ 371 (c)(1),
(2) Date: Jul. 12, 2023

(87) PCT Pub. No.: WO2022/163574
PCT Pub. Date: Aug. 4, 2022

(65) Prior Publication Data
US 2024/0224422 A1      Jul. 4, 2024

(30) Foreign Application Priority Data

Jan. 28, 2021      (JP) ................................. 2021-012421

(51) Int. Cl.
*H05K 1/09*          (2006.01)
*B22F 7/04*          (2006.01)
(52) U.S. Cl.
CPC ................ *H05K 1/09* (2013.01); *B22F 7/04*
(2013.01); *B22F 2301/10* (2013.01)

(58) Field of Classification Search
CPC ...... H05K 1/09; H05K 1/0306; H05K 3/4629;
H05K 1/092; H05K 3/38; B22F 2301/10;
B22F 7/04; B22F 7/064; B22F 7/08;
C22C 1/051
USPC ........................................................ 174/255
See application file for complete search history.

(56) References Cited

U.S. PATENT DOCUMENTS

| 6,248,960 | B1 | 6/2001 | Ami et al. | |
| 2004/0023011 | A1* | 2/2004 | Sumi ................. | H01L 23/49883 |
| | | | | 428/210 |
| 2009/0121345 | A1* | 5/2009 | Sunohara .......... | H01L 23/49827 |
| | | | | 257/E21.59 |

(Continued)

FOREIGN PATENT DOCUMENTS

| EP | 1383361 A2 | 1/2004 |
| JP | 2000-244123 A | 9/2000 |

(Continued)

OTHER PUBLICATIONS

International Search Report dated Apr. 19, 2022 for PCT International Application No. PCT/JP2022/002423.

*Primary Examiner* — Stanley Tso
*Assistant Examiner* — Sidi M Maiga
(74) *Attorney, Agent, or Firm* — Volpe Koenig

(57) ABSTRACT
A wiring board includes an insulation layer and an electrical conductor layer that are layered. The insulation layer is a glass ceramic. The electrical conductor layer is a sintered body of a plurality of crystallites containing copper as a main component. The plurality of crystallites include polygonal crystallites having linear sides. The plurality of crystallites are in contact with each other via the linear sides as grain boundaries.

14 Claims, 3 Drawing Sheets

(56)                 References Cited

U.S. PATENT DOCUMENTS

| | | | | |
|---|---|---|---|---|
| 2012/0044652 | A1* | 2/2012 | Horikawa | H05K 3/244 |
| | | | | 361/728 |
| 2012/0188734 | A1* | 7/2012 | Mikado | H01L 24/19 |
| | | | | 361/761 |
| 2016/0338201 | A1* | 11/2016 | Kiyono | B22F 1/10 |
| 2019/0069396 | A1 | 2/2019 | Oka et al. | |
| 2020/0043654 | A1 | 2/2020 | Furusawa | |

FOREIGN PATENT DOCUMENTS

| | | | | |
|---|---|---|---|---|
| JP | 2003-277852 | A | | 10/2003 |
| JP | 2015038909 | A | * | 2/2015 |
| JP | 2001-202823 | A | | 7/2021 |
| WO | 2017/187753 | A1 | | 11/2017 |

* cited by examiner

| Number of Sides | Number of Crystallites |
|---|---|
| 0 | 7 |
| 1 | 9 |
| 2 | 24 |
| 3 | 23 |
| 4 | 21 |
| 5 | 4 |

WIRING BOARD

CROSS-REFERENCE TO RELATED APPLICATIONS

This application is National Stage Application of International Application No. PCT/JP2022/002423, filed on Jan. 24, 2022, which designates the United States, incorporated herein by reference, and which claims the benefit of priority from Japanese Patent Application No. 2021-012421, filed on Jan. 28, 2021, the entire contents of which are incorporated herein by reference.

TECHNICAL FIELD

An embodiment of the present disclosure relates to a wiring board.

BACKGROUND OF INVENTION

Conventionally, a known wiring board includes an insulation layer and an electrical conductor layer containing copper as a main component. Such a wiring board is obtained, for example, by simultaneously firing an electrical conductor layer in which a metal oxide is added to copper powder and a glass ceramic as an insulation layer material.

CITATION LIST

Patent Literature

Patent Document 1: JP 2003-277852 A

SUMMARY

In an aspect of the present disclosure, a wiring board includes an insulation layer and an electrical conductor layer that are layered. The insulation layer is a glass ceramic. The electrical conductor layer is a sintered body of a plurality of crystallites containing copper as a main component. The plurality of crystallites include polygonal crystallites each having linear sides, and the crystallites are in contact with each other via the linear sides as grain boundaries.

DESCRIPTION OF EMBODIMENTS

Hereinafter, embodiments of a wiring board disclosed in the present disclosure will be described with reference to the accompanying drawings. The present disclosure is not limited by the following embodiment.

Figure 1:
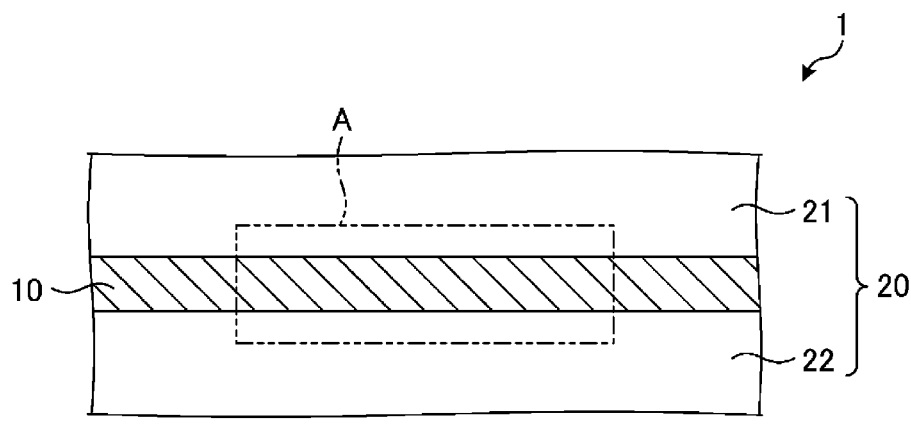
FIG. 1 is a cross-sectional view illustrating an example of a wiring board according to an embodiment.

FIG. 1 is a cross-sectional view illustrating an example of a wiring board according to an embodiment. As illustrated in FIG. 1, in the embodiment, a wiring board 1 includes an insulation layer 20 and an electrical conductor layer 10.

The insulation layer 20 is a glass ceramic. The insulation layer 20 may include a first layer 21 and a second layer 22 that face each other with the electrical conductor layer 10 interposed therebetween. The first layer 21 and the second layer 22 are located to sandwich both surfaces of the electrical conductor layer 10 in the thickness direction.

The electrical conductor layer 10 contains copper as a main component. Specifically, the electrical conductor layer 10 contains 50 mass % or more of copper. The electrical conductor layer 10 may contain 70 mass % or more, 80 mass % or more, or 90 mass % or more and less than 100 mass % (99 mass % or less) of copper.

Figure 2:
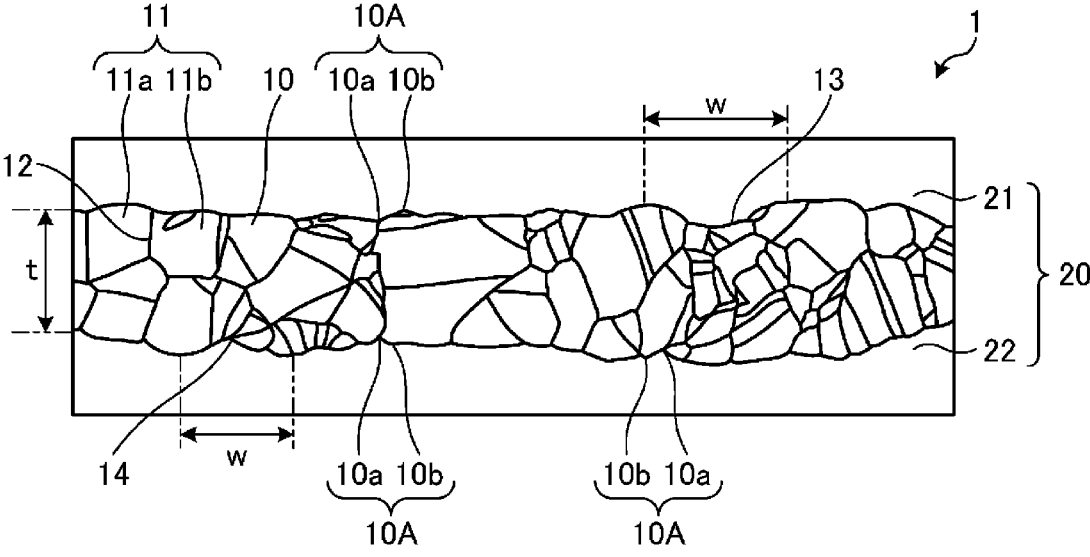
FIG. 2 is an enlarged view of a region A illustrated in FIG. 1.

The electrical conductor layer 10 is a sintered body of a plurality of crystallites. FIG. 2 is an enlarged view of a region A illustrated in FIG. 1. As illustrated in FIG. 2, the electrical conductor layer 10 includes crystallites 11 having a polygonal shape in a cross-sectional view.

A plurality of adjacent crystallites 11a, 11b are in contact with each other via linear sides as grain boundaries 12 of the crystallites 11. Accordingly, interface electrical conductivity at high frequencies can be enhanced. A wiring board exhibiting high interface electrical conductivity at high frequencies can be obtained.

Figures 3, 4:
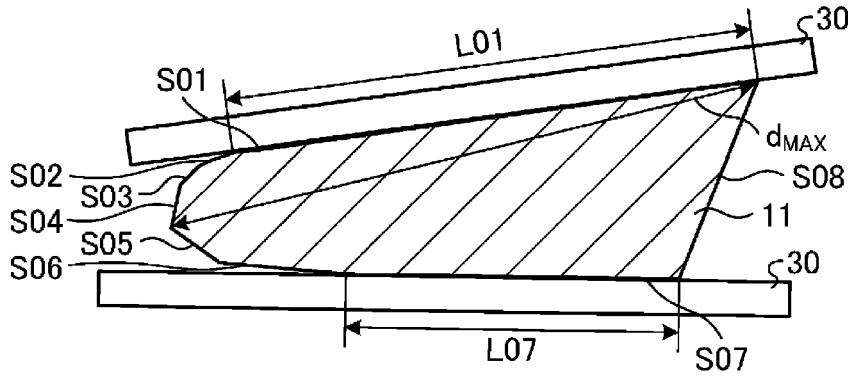
FIG. 3 is an explanatory diagram illustrating an evaluation method for crystallites.
FIG. 4 is a diagram showing the evaluation results of a plurality of crystallites contained in an electrical conductor layer.

Here, an evaluation method for the "linear sides" of the crystallites 11 will be described with reference to FIG. 3. FIG. 3 is a diagram illustrating an evaluation method for crystallites. As illustrated in FIG. 3, the crystallite 11 has a polygonally shaped cross section. The crystallite 11 illustrated as an example in FIG. 3 has an octagonal contour having sides S01 to S08. For an image obtained by photographing the electrical conductor layer 10 including the cross section, for example, a scale (or ruler) 30 is prepared and positioned along the side S01. When the length of a portion of the side S01, which extends along the scale (or ruler) 30 is at least half the longest diameter $d_{MAX}$ of the crystallite 11, the side is defined as a "linear side". For each of the other sides S02 to S08, whether the side is a "linear side" is evaluated in the same way as the side S01. In the example illustrated in FIG. 3, the side S01 having a length L01 and the side S07 having a length L07 are evaluated as "linear sides". That is, the crystallite 11 illustrated in FIG. 3 has two "linear sides". The longest diameter $d_{MAX}$ of the crystallite 11 is preferably 1 μm or more and 10 μm or less.

For example, for the electrical conductor layer 10 according to the embodiment, the aforementioned evaluation is repeated for each side of each of the plurality of crystallites 11. In such a case, the plurality of crystallites 11 may include 70% or more of the crystallites 11 each having two or more linear sides. As described above, in the wiring board 1 including the electrical conductor layer 10 including 70% or more of the crystallites 11 each having two or more linear sides, for example, a decrease in interface electrical conductivity at frequencies of from 1 GHz to 49 GHz can be reduced. Accordingly, interface electrical conductivity at high frequencies can be enhanced.

FIG. 4 is a diagram showing the evaluation results of a plurality of crystallites contained in an electrical conductor layer. As shown in FIG. 4, the electrical conductor layer 10 includes the crystallites 11 each having 0 to 5 linear sides. While the total number of crystallites 11 is 7+9+24+23+21+4=88, the number of crystallites 11 each having two or more linear sides is 24+23+21+4=72, and the percentage thereof is 72/88×100≈81.8%.

In this case, the wiring board 1 is cut at a position where the cross section of the electrical conductor layer 10 is visible, and the cross-sectional plane is polished, and thus a sample for observing the cross section is produced.

The polished plane is analyzed by using an electron back scattered diffraction pattern (EBSD) method. The imaging range of the sample in the thickness direction and the length direction of the electrical conductor layer 10 is set, for example, as below. The number of crystallites 11 included in the imaging range is, for example, 50 or more and 100 or less.

Thickness direction of the electrical conductor layer 10: A range in which one layer of the electrical conductor layer 10 is visible is photographed. Length direction of the electrical conductor layer 10: A range of about 20 μm is photographed. The length direction may be in a range of from 10 μm or more to 20 μm or less.

In the embodiment, the wiring board 1 may have an interface electrical conductivity of, for example, 90% or more at a frequency of 2 GHZ. The wiring board 1 may have an interface electrical conductivity of, for example, 85% or more at a frequency of 30 GHz. The wiring board 1 may have an interface electrical conductivity of, for example, 78% or more at a frequency of 49 GHz. In the wiring board 1, the interface electrical conductivity is 78% or more in a frequency range of 30 GHz or higher and 49 GHz or lower. As described above, in the embodiment, the wiring board 1 can provide a small decrease in interface electrical conductivity, for example, at a frequency of from 2 GHz to 49 GHz. Accordingly, the interface electrical conductivity at high frequencies can be enhanced.

The electrical conductor layer 10 may include recessed portions 13, 14 in surfaces along the insulation layer 20. Here, the maximum depth of each of the recessed portions 13, 14 may be, for example, 1 μm or more and 3 μm or less. A width w of the recessed portions 13, 14 in a direction along the insulation layer 20 is preferably in a range of 50% or more and 90% or less of an average thickness t of the electrical conductor layer 10. Since the electrical conductor layer 10 includes the recessed portions 13, 14, for example, adhesiveness between the electrical conductor layer 10 and the insulation layer 20 can be enhanced. The radius of curvature of each of the recessed portions 13, 14 is preferably 5 μm or more and 50 μm or less, and in particular, the radius of curvature is preferably 10 μm or more and 30 μm or less.

The average thickness t of the electrical conductor layer 10 is obtained, for example, by averaging thicknesses of the electrical conductor layer 10 measured at respective points (a total of five points) when an observed region (for example, a length of 50 μm) is equally divided into four portions in the length direction. The thickness of each point of the electrical conductor layer 10 is a length in a direction orthogonal to the longitudinal direction of the electrical conductor layer 10. The average thickness t of the electrical conductor layer 10 can be, for example, 5 μm or more and 15 μm or less and can be 6.5 μm or more and 10 μm or less.

The electrical conductor layer 10 may include the recessed portion 13 or the recessed portion 14 only in one surface of both surfaces facing the insulation layer 20, or may include the recessed portions 13, 14 in both surfaces of the electrical conductor layer 10 facing the insulation layer 20. The recessed portion 13 and/or the recessed portion 14 included in the electrical conductor layer 10 may be a plurality of recessed portions.

In addition to the recessed portions 13, 14 described above that are relatively large, the electrical conductor layer 10 may also include a plurality of projecting and recessed portions 10A each having a width smaller than those of the recessed portions 13, 14 (in FIG. 2, the position of a recessed portion is referred to as a recessed portion 10a, and the position of a projecting portion located adjacent to the recessed portion is referred to as a projecting portion 10b). Here, even when the electrical conductor layer 10 includes the projecting and recessed portions 10A, the difference between the maximum thickness tmax and the minimum thickness tmin of the electrical conductor layer 10 is preferably 1 μm or more and 3 μm or less. The electrical conductor layer 10 includes the projecting and recessed portions 10A, and thus, for example, the adhesiveness between the electrical conductor layer 10 and the insulation layer 20 can be enhanced. Variations in interface electrical conductivity can also be reduced.

The electrical conductor layer 10 may include silica particles on the surface thereof. In other words, in the wiring board 1, silica is present in a particulate state on the surface of the electrical conductor layer 10. Here, the surface of the electrical conductor layer 10 refers to the area near the interface between the insulation layer 20 and the electrical conductor layer 10 when the electrical conductor layer 10 is formed on the surface of the insulation layer 20. The area near the interface includes a range from the surface of the electrical conductor layer 10 to a small width inside the electrical conductor layer 10. The small width is a range within 1 μm from the surface of the electrical conductor layer 10. The silica particles are present on the surface of the electrical conductor layer 10, and thus, for example, the adhesiveness between the electrical conductor layer 10 and the insulation layer 20 can be further enhanced. Note that the silica particles may be present on the entire surface of the electrical conductor layer 10 facing the insulation layer 20, or may be present on a portion of the surface of the electrical conductor layer 10. When a plurality of silica particles are present on the surface of the electrical conductor layer 10, these silica particles may be present such that the individual particles are isolated from each other.

The reason the adhesiveness between the insulation layer 20 and the electrical conductor layer 10 is enhanced by the presence of the silica particles on the surface of the electrical conductor layer 10 or in the area near the interface between the insulation layer 20 and the electrical conductor layer 10 is considered to be due to the fact that the shrinkage behavior of a metal material (for example, copper) used in the electrical conductor layer 10 during firing is close to the shrinkage behavior of the silica particles. In this case, the reason the shrinkage behavior of the metal material used in the electrical conductor layer 10 during firing is close to the shrinkage behavior of the silica particles is considered to be due to the fact that the size of the silica particles is minute. For example, instead of the silica particles having the size described below, silica particles having a larger size have a wide particle size distribution based on the size. Heat capacity also increases due to the size. These factors cause changes in sintering behavior and adhesiveness. When composite oxide glass powder is used instead of silica particles having a minute size, the glass powder contains a plurality of components, and thus a temperature range in which the glass powder is in a molten state is wider than a temperature range of the silica particles having a minute size. For example, in the glass powder, a melting temperature may start at a low temperature compared with the silica particles having a minute size. The glass powder may often have a wide particle size distribution. When the glass powder having these properties is used, aggregation or transfer due to sintering is likely to occur in a printed pattern where the glass powder becomes the electrical conductor layer 10 during firing. As a result, at the time of forming the electrical conductor layer 10, metal particles are likely to undergo grain growth and voids are likely to be generated in the electrical conductor layer 10. This is because the glass powder easily diffuses from the section of the printed pattern to a region to be the insulation layer 20. When the silica particles having a minute size are used, a temperature range in which the silica particles are in a molten state is narrower than a temperature range when the glass powder is used because the silica particles have a single composition. As a result, the electrical conductor layer 10 becomes dense, and the recessed portions 13, 14 having a gentle shape are easily formed in the surface along the insulation layer 20. The average particle diameter of the silica particles is preferably 10 nm or more and 80 nm or less. Among the silica particles, silica particles having an average particle diameter of 30 nm are preferred. The percentage of the integrated amount of the lower limit of 20 nm and the upper limit of 40 nm is preferably 70% or more.

In addition to the recessed portions 13, 14, the electrical conductor layer 10 may include the projecting and recessed portions 10A on both surfaces facing the insulation layer 20. In addition to the recessed portions 13, 14, portions forming the projecting and recessed portions 10A are provided on both surfaces of the electrical conductor layer 10 facing the insulation layer 20, that is, the surfaces of the electrical conductor layer 10 facing the first layer 21 and the second layer 22 of the insulation layer 20. Accordingly, for example, the adhesiveness between the electrical conductor layer 10 and the insulation layer 20 can be further enhanced.

The electrical conductor layer 10 may also be located on the surface of the wiring board 1 exposed to the outside. In such a case, the electrical conductor layer 10 may be located on one surface of the wiring board 1 or may be located on both surfaces of the wiring board 1.

EXAMPLES

Specifically, wiring boards were produced, and differences in interface electrical conductivity were evaluated.

First, a mixture of 40 wt % of alumina particles and 60 wt % of borosilicate glass was prepared as a material of an insulation layer. The mixture is a glass ceramic raw material having a firing temperature of 900° C. or higher and 1000° C. or lower. As an organic binder, 20 parts by mass of isobutyl methacrylate resin and dibutyl phthalate were used with respect to 100 parts by mass of the glass ceramic raw material, and a green sheet having a thickness of 100 μm was produced by doctor blade molding.

Copper powder having an average particle diameter of 2 μm and silica particles having an average particle diameter of 20 nm were prepared as raw materials of an electrical conductor layer. The silica particles have a percentage of the integrated amount of the lower limit of 10 nm and the upper limit of 30 nm of 70% or more. The amount of silica particles added was 1 part by mass with respect to 100 parts by mass of copper powder. As the organic binder, isobutyl methacrylate resin and a mixed solvent of butyl carbitol acetate and dibutyl phthalate were used. A conductive paste containing copper powder and silica particles was prepared by adding 5 parts by mass of isobutyl methacrylate resin with respect to 100 parts by mass of copper powder and further adding a mixed solvent of butyl carbitol acetate and dibutyl phthalate.

The conductive paste was printed on both surfaces of the produced green sheet in a predetermined area and fired. Firing was performed in a reducing atmosphere using a nitrogen-hydrogen mixed gas at a maximum temperature of 930° C. and a holding time of 2 hours. A plurality of green sheets were layered so as to have a thickness of 500 μm.

On the other hand, a wiring board according to a reference example was produced in the same manner as the wiring board according to the example described above except that the average particle diameter of the silica particles was 1 μm.

By using the wiring boards produced as described above, the interface electrical conductivity was measured. The interface electrical conductivity was measured by a cylindrical dielectric resonator method described below. As a sample for measurement, a sample having a diameter of 50 mm and having the electrical conductor layer 10 formed substantially entirely on both sides was used.

The method of measuring interface electrical conductivity by using the cylindrical dielectric resonator method is a method of measuring electrical conductivity at the interface between a conductor and an insulation layer, i.e., at the conductor interface, by attaching an insulation layer having the conductor formed therein to both end faces or one end face of a dielectric cylinder made of a dielectric material having known relative permittivity and dielectric loss such that a predetermined relationship is established and thereby forming a dielectric resonator.

The principle of this measurement method is based on the fact that when conductor plates large enough to ignore a cut-edge effect (usually, conductor plates having a diameter D of about three times a diameter d of the dielectric cylinder) are placed in parallel on both end surfaces of the dielectric cylinder having a predetermined dimensional ratio (height h/diameter d) and supported thereon to form an electromagnetic field resonator, a high-frequency current flowing through the conductor plates in the TEomn resonance mode (hereinafter, referred to as the TEomn mode) is distributed only on the short-circuited surface, i.e., the facing surface between the dielectric body and the conductor.

In the dielectric resonator, by using the fact that the high-frequency current flowing through the conductor due to the TEomn mode (m=1, 2, 3, . . . , n=1, 2, 3, . . . ) is distributed only at the interface between the conductor and a dielectric board in contact with the dielectric cylinder, interface electrical conductivity can be calculated from the measured resonance frequencies f0 of the TEomn mode (m=1, 2, 3, . . . , n=1, 2, 3, . . . ) and no-load Q, Qu. The interface electrical conductivity was measured in the frequency range of 2 GHz or higher and 49 GHz or lower. The results are shown in FIG. 5.

Figure 5:
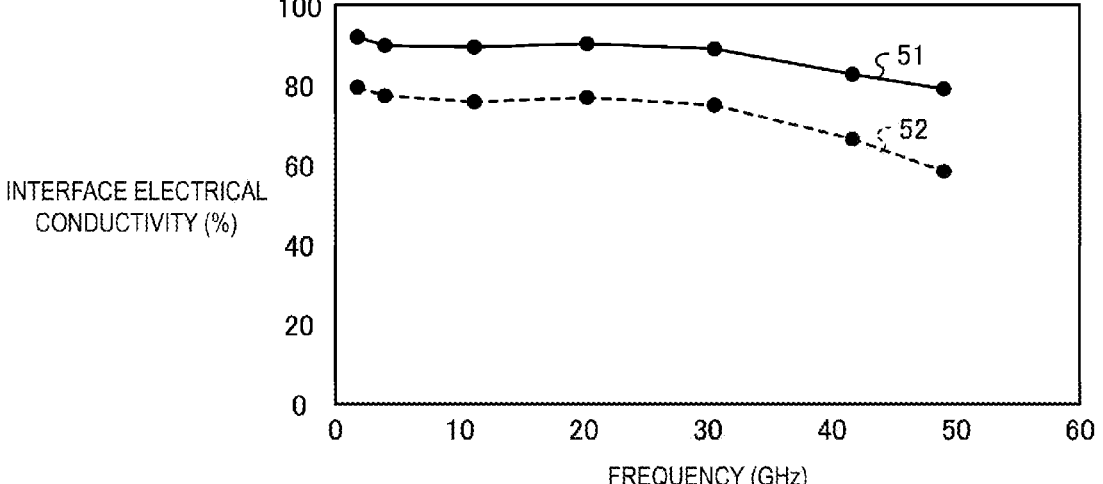
FIG. 5 is a graph showing the relationship between the frequency and the interface electrical conductivity in the wiring boards according to a practical example and a reference example.

FIG. 5 is a graph showing the relationship between the frequency and the interface electrical conductivity in the wiring boards according to the practical example and the reference example. A solid line 51 indicates the measurement result of the wiring board according to the practical example, and a dashed line 52 indicates the measurement result of the wiring board according to the reference example.

As shown in FIG. 5, in the wiring board according to the practical example, the interface electrical conductivity was higher over the entire measured frequency range than that of the wiring board according to the reference example. In particular, in the wiring board according to the reference example, a significant decrease in interface electrical conductivity in the frequency range of from 30 to 48 GHz was observed. However, in the wiring board according to the practical example, a small decrease in interface electrical conductivity was observed. As a result, it was revealed that the wiring board according to the practical embodiment can provide enhanced interface electrical conductivity at high frequencies.

Also, when the interface electrical conductivity of an organic board using copper foil as an electrical conductor layer was measured, the interface electrical conductivities at the frequencies of 2 GHz, 30 GHZ, and 49 GHz were 99%, 81%, and 61%, respectively, and the result indicates that a decrease in interface electrical conductivity was large particularly in the frequency range of from 30 to 48 GHZ.

As described above, in the embodiment, the wiring board 1 includes the insulation layer 20 and the electrical conductor layer 10 that are layered. The insulation layer 20 is a glass ceramic. The electrical conductor layer 10 is a sintered body of the plurality of crystallites 11 containing copper as a main component. The plurality of crystallites 11 include the crystallites 11 that are polygonal and that have linear sides, and the crystallites 11 are in contact with each other via the linear sides as the grain boundaries 12. Accordingly, interface electrical conductivity at high frequencies can be enhanced.

Additional effects and other aspects can be easily derived by a person skilled in the art. Thus, a wide variety of aspects of the present disclosure are not limited to the specific details and representative embodiments represented and described above. Accordingly, various changes are possible without departing from the spirit or scope of the general inventive concepts defined by the appended claims and their equivalents.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A wiring board comprising:
an insulation layer and an electrical conductor layer that are layered, the insulation layer and the electrical conductor layer being in contact with each other, wherein
the insulation layer is a glass ceramic,
the electrical conductor layer is a sintered body of a plurality of crystallites containing copper as a main component,
the plurality of crystallites comprises polygonal crystallites having linear sides, the crystallites being in contact with each other via the linear sides as grain boundaries,
the electrical conductor layer contains silica particles, and
the electrical conductor layer has a recessed portion on a surface along the insulation layer;
wherein:
the silica particles are present on and within 1 μm of a surface of the electrical conductor layer that faces the insulation layer,
the silica particles have an average particle diameter of 10 nm or more and 80 nm or less;

a width of the recessed portion in a direction along the insulation layer is 50% or more of an average thickness of the electrical conductor layer,
the recessed portion has a radius of curvature of 10 μm or more and 30 μm or less, and
70% or more of a number of crystallites among the plurality of crystallites have two or more linear sides.

2. The wiring board according to claim 1, wherein
a width of the recessed portion in a direction along the insulation layer is 70% or more of an average thickness of the electrical conductor layer.

3. The wiring board according to claim 2, wherein the width of the recessed portion is 90% or less of the average thickness of the electrical conductor layer.

4. The wiring board according to claim 1, wherein
at least two surfaces of the electrical conductor layer are sandwiched by the insulation layer, and the at least two surfaces have projecting and recessed portions along the insulation layer.

5. The wiring board according to claim 1, wherein
the electrical conductor layer contains copper as a metal component, and a content of the copper is 80 mass % or more and 99 mass % or less.

6. The wiring board according to claim 1, wherein the electrical conductor layer has an interface electrical conductivity of 78% or more from 30 GHz to 49 GHz, inclusive.

7. The wiring board according to claim 1, wherein
the silica particles are present as discrete, isolated particles on the surface of the electrical conductor layer facing the insulation layer rather than as a continuous film.

8. The wiring board according to claim 1, wherein
the silica particles have an average particle diameter of about 30 nm.

9. The wiring board according to claim 8, wherein a percentage of an integrated amount between 20 nm and 40 nm is 70% or more.

10. The wiring board according to claim 1, wherein the recessed portion has a maximum depth of 1 μm or more and 3 μm or less.

11. The wiring board according to claim 1, wherein a difference between a maximum thickness and a minimum thickness of the electrical conductor layer is 1 μm or more and 3 μm or less.

12. The wiring board according to claim 2, wherein a side of a crystallite is determined to be a linear side when a straight line is brought into contact with the side and the side coincides with the straight line over a length corresponding to at least one-half of a longest diameter (d_MAX) of the crystallite.

13. The wiring board according to claim 1, wherein the electrical conductor layer is obtained by sintering a copper-particle paste including the silica particles in a reducing atmosphere comprising nitrogen and hydrogen at a peak temperature of 900° C. to 1000° C.

14. The wiring board according to claim 1, wherein the silica particles are silicon dioxide ($SiO_2$).

* * * * *